(12) United States Patent
Kim et al.

(10) Patent No.: US 8,247,893 B2
(45) Date of Patent: Aug. 21, 2012

(54) MOUNTABLE INTEGRATED CIRCUIT PACKAGE SYSTEM WITH INTRA-STACK ENCAPSULATION

(75) Inventors: YoungJoon Kim, Ichon-si (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 86 days.

(21) Appl. No.: 11/965,653

(22) Filed: Dec. 27, 2007

(65) Prior Publication Data
US 2009/0166886 A1    Jul. 2, 2009

(51) Int. Cl.
*H01L 23/02* (2006.01)
*H01L 21/00* (2006.01)
(52) U.S. Cl. .......... 257/686; 257/777; 438/109
(58) Field of Classification Search .......... 257/686, 257/777, 723, 724; 438/107, 109, 110
See application file for complete search history.

(56) References Cited

U.S. PATENT DOCUMENTS

| | | | |
|---|---|---|---|
| 5,977,640 A * | 11/1999 | Bertin et al. | 257/777 |
| 6,137,164 A | 10/2000 | Yew et al. | |
| 6,650,006 B2 | 11/2003 | Huang et al. | |
| 6,787,916 B2 * | 9/2004 | Halahan | 257/777 |
| 6,861,288 B2 | 3/2005 | Shim et al. | |
| 6,919,627 B2 | 7/2005 | Liu et al. | |
| 7,015,571 B2 | 3/2006 | Chang et al. | |
| 7,026,709 B2 | 4/2006 | Tsai et al. | |
| 7,198,980 B2 | 4/2007 | Jiang et al. | |
| 7,262,074 B2 | 8/2007 | Hall et al. | |
| 7,279,786 B2 * | 10/2007 | Kim | 257/686 |
| 7,288,835 B2 | 10/2007 | Yim et al. | |
| 7,298,033 B2 | 11/2007 | Yoo | |
| 7,309,913 B2 | 12/2007 | Shim et al. | |
| 7,312,518 B2 * | 12/2007 | Liao et al. | 257/686 |
| 7,354,800 B2 | 4/2008 | Carson | |
| 7,364,945 B2 | 4/2008 | Shim et al. | |
| 7,391,105 B2 | 6/2008 | Yeom | |
| 7,504,284 B2 | 3/2009 | Ye et al. | |
| 7,557,443 B2 | 7/2009 | Ye et al. | |
| 2004/0178508 A1 | 9/2004 | Nishimura et al. | |
| 2006/0175695 A1 * | 8/2006 | Lee | 257/686 |
| 2007/0176275 A1 | 8/2007 | Singleton et al. | |
| 2007/0181990 A1 | 8/2007 | Huang et al. | |
| 2007/0216010 A1 | 9/2007 | Yim et al. | |
| 2009/0166834 A1 | 7/2009 | Yoon et al. | |
| 2009/0243073 A1 | 10/2009 | Carson et al. | |

* cited by examiner

*Primary Examiner* — S. V. Clark
(74) *Attorney, Agent, or Firm* — Ishimaru & Associates LLP; Mikio Ishimaru; Stanley Chang (57) ABSTRACT

A mountable integrated circuit package system comprising: mounting a first integrated circuit device over a package carrier; mounting an interposer including a central aperture over the package carrier, an intra-stack interconnect connected between the interposer and the package carrier, and the first integrated circuit device within the central aperture; and forming an intra-stack encapsulation over the package carrier and surrounding the interposer.

20 Claims, 7 Drawing Sheets

MOUNTABLE INTEGRATED CIRCUIT PACKAGE SYSTEM WITH INTRA-STACK ENCAPSULATION

CROSS-REFERENCE TO RELATED APPLICATION(S)

The present application contains subject matter related to U.S. patent application Ser. No. 11/965,641, now U.S. Pat. No. 7,800,212. The related application is assigned to STATS ChipPAC Ltd.

TECHNICAL FIELD

The present invention relates generally to an integrated circuit package system and more particularly to an integrated circuit package-on-package system with encapsulation.

BACKGROUND ART

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". The needs for portable personal electronics, such as cell phones, digital cameras, music players, personal digital assistants (PDA's), and location-based devices are particularly acute and have further driven the need for increased integrated circuit density.

This increased integrated circuit density has led to the development of multi-chip packages in which more than one integrated circuit can be packaged. For example, package-on-package (POP) systems may be used to integrate and package stacks of circuits. A POP system may be manufactured from a top assembly and a bottom assembly where each assembly carries at least one integrated circuit.

However, in some cases, the bottom assembly may warp before or after the top assembly has been mounted. This may result in poor yields, device failures, or reduced device lifetimes due to a variety of problems such as compromised mechanical properties or poor electrical connectivity. Contemporary electronics expose integrated circuits, integrated circuit packages, and electronic subassemblies to more demanding and sometimes harsh environmental conditions, such as cold, heat, and humidity requiring integrated circuit packages to provide robust mechanical structures. The range of operating conditions may also cause warpage resulting in failure, field returns, and increased cost.

In some cases an underfill encapsulant material is applied in the gap directly between an integrated circuit (IC) chip stack and the bottom package carrier of the bottom assembly. This underfill encapsulation protects and covers the connections between the IC and the bottom package carrier.

Thus, a need still remains for an integrated circuit package-on-package system that provides a low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system including: mounting a first integrated circuit device over a package carrier; mounting an interposer including a central aperture over the package carrier, an intra-stack interconnect connected between the interposer and the package carrier, and the first integrated circuit device within the central aperture; and forming an intra-stack encapsulation over the package carrier and surrounding the interposer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Figure 1:
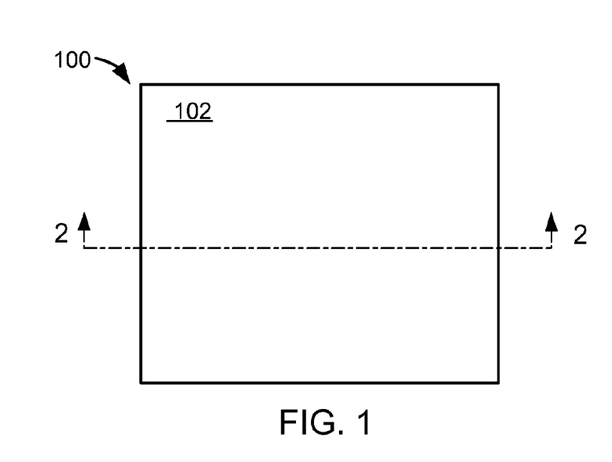
FIG. 1 is a top view of a mountable integrated circuit package system in a first embodiment of the present invention.

Referring now to FIG. 1, therein is shown a top view of a mountable integrated circuit package system 100 in a first embodiment of the present invention. The top view depicts a top integrated circuit device 102 of the mountable integrated circuit package system 100. For example, the top integrated circuit device 102 may be an integrated circuit die, such as a flip chip, or a packaged integrated circuit.

Figure 2:
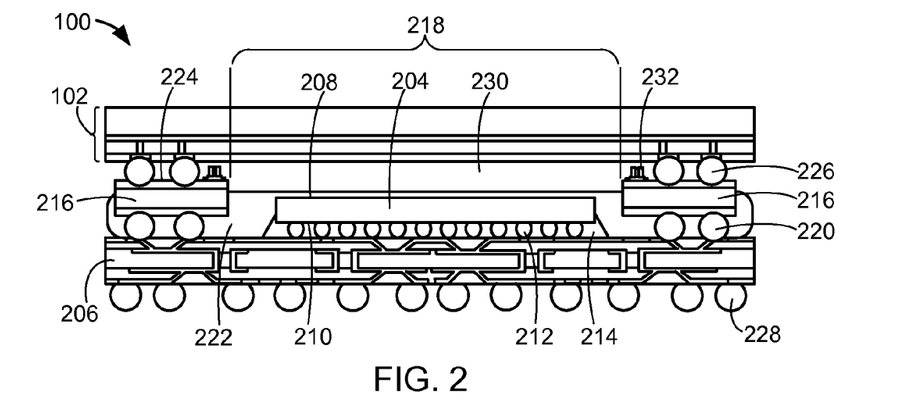
FIG. 2 is a cross-sectional view of the mountable integrated circuit package system along line 2-2 of FIG. 1.

Referring now to FIG. 2, therein is shown a cross-sectional view of the mountable integrated circuit package system 100 along line 2-2 of FIG. 1. The cross-sectional view depicts a first integrated circuit device 204, such as a flip chip or a packaged integrated circuit, mounted over a package carrier 206, such as a substrate. The first integrated circuit device 204 includes a top device side 208 which is non-active and a bottom device side 210 which is active, wherein the bottom device side 210 which is active includes active circuitry fabricated thereon. Connection between the bottom device side 210 and the package carrier 206 may be established through a first internal interconnect 212, such as a solder bump between the bottom device side 210 and the package carrier 206.

Optionally, an underfill 214, such as a nonconductive epoxy, may fill any gaps between the first integrated circuit device 204 and the package carrier 206. The underfill 214 may surround the first internal interconnect 212 providing mechanical support and also function to protect the connection between the bottom device side 210 and the package carrier 206.

An interposer 216, such as a substrate, having a central aperture 218 is mounted over the package carrier 206 with the first integrated circuit device 204 within the central aperture 218 of the interposer 216. An intra-stack interconnect 220, such as a solder ball, connects the interposer 216 and the package carrier 206. The interposer 216 may include other structures (not shown), such as metal traces, metal layers, insulating layers, electrical vias, landing pads, or a combination thereof.

An intra-stack encapsulation 222, such as an encapsulation of molding compound or a molded underfill (MUF), is over the package carrier 206, covering the first integrated circuit device 204 and the intra-stack interconnect 220. The intra-stack encapsulation 222 surrounds the interposer 216 around an outer perimeter of the interposer 216, preferably partially filling the central aperture 218 and exposing a top interposer side 224 of the interposer 216. The intra-stack encapsulation 222 may also surround the first internal interconnect 212 and fill any gaps between the first integrated circuit device 204 and the package carrier 206, any gaps between the interposer 216 and the package carrier 206, or a combination thereof.

The top integrated circuit device 102 is mounted above the interposer 216 and over the first integrated circuit device 204, the intra-stack encapsulation 222, and the package carrier 206. An electrical connector 226, such as a solder ball, may connect the top integrated circuit device 102 and the interposer 216. In some cases, the interposer 216 may provide electrical interconnection between the top integrated circuit device 102 and the package carrier 206 through the electrical connector 226 and the intra-stack interconnect 220. External connective elements 228, such as solder balls, may also be provided under the package carrier 206 for further electrical connection to the next system level.

A cavity 230 may be formed between the top integrated circuit device 102 and the top interposer side 224, the intra-stack encapsulation 222, the first integrated circuit device 204, or a combination thereof. The cavity 230 may provide clearance for airflow between the top integrated circuit device 102 and the first integrated circuit device 204 for thermal management. However, it is understood that in some cases, the cavity 230 may or may not exist, or may be larger or smaller than the cavity 230 illustrated.

Optionally, a passive device 232, such as a discrete resistor, capacitor, or inductor, may be mounted over the interposer 216 and under the top integrated circuit device 102. It is understood that more than one type of the passive device 232 may be mounted on the interposer 216. For illustrative purposes, the passive device 232 may be mounted in more than one location on the interposer 216, and may be placed symmetrically about the central aperture 218. However, it is understood that each of the passive device 232 mounted need not be arranged on the interposer 216 in a symmetrical configuration.

It is understood that the number and placement of the first internal interconnect 212, the intra-stack interconnect 220, the electrical connector 226, and the external connective elements 228 as shown are provided for illustrative purposes, the number and placement for each may vary as needed.

It has been discovered that the present invention improves the yield and reliability of the mountable integrated circuit package system 100 by providing the intra-stack encapsulation 222 around the interposer 216 and in direct contact with the first integrated circuit device 204 for additional planar rigidity over the package carrier 206 and the first integrated circuit device 204. This additional planar rigidity mitigates or eliminates warpage of the package carrier 206 which may be caused by mismatch in the coefficient of thermal expansion (CTE) between the first integrated circuit device 204 and the package carrier 206.

Figure 3:
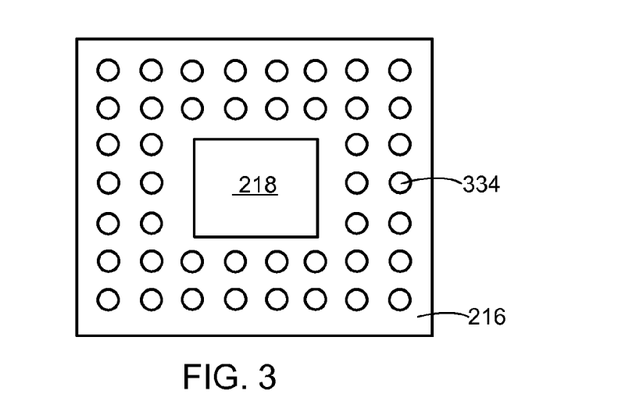
FIG. 3 is a bottom view of the interposer including a central aperture of the mountable integrated circuit package system of FIG. 2.

Referring now to FIG. 3, therein is shown a bottom view of the interposer 216 having the central aperture 218 of FIG. 2. The bottom view of the interposer 216 depicts contact pads 334 exposed on the interposer 216 for electrical connection under the interposer 216, such as for connection between the interposer 216 and the package carrier 206. The contact pads 334 may also exist on an opposing side of the bottom view of the interposer 216, as in the top interposer side 224 of FIG. 2, to provide further electrical connection over the interposer 216, such as for connection between the top interposer side 224 and the top integrated circuit device 102 of FIG. 2.

For illustrative purposes, the interposer 216 is shown with the contact pads 334 in a uniformly distributed configuration, although it is understood that the interposer 216 may have the contact pads 334 in a different configuration, or a non-uniform distribution over the interposer 216.

Figure 4:
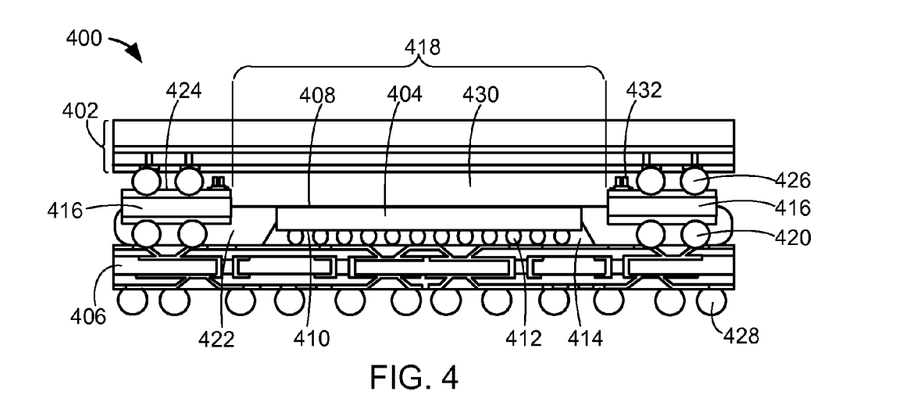
FIG. 4 is a cross-sectional view of a mountable integrated circuit package system exemplified by the top view of FIG. 1 in a second embodiment of the present invention.

Referring now to FIG. 4, therein is shown a cross-sectional view of a mountable integrated circuit package system 400 exemplified by the top view of FIG. 1 in a second embodiment of the present invention. The cross-sectional view depicts a first integrated circuit device 404, such as a flip chip or a packaged integrated circuit, mounted over a package carrier 406, such as a substrate. The first integrated circuit device 404 includes a top device side 408 which is non-active and a bottom device side 410 which is active, wherein the bottom device side 410 which is active includes active circuitry fabricated thereon. Connection between the bottom device side 410 and the package carrier 406 may be established through a first internal interconnect 412, such as a solder bump between the bottom device side 410 and the package carrier 406.

Optionally, an underfill 414, such as a nonconductive epoxy, may fill any gaps between the first integrated circuit device 404 and the package carrier 406. The underfill 414 may surround the first internal interconnect 412 providing mechanical support and also function to protect the connection between the bottom device side 410 and the package carrier 406.

An interposer 416, such as a substrate, including a central aperture 418 is mounted over the package carrier 406 with the first integrated circuit device 404 within the central aperture 418 of the interposer 416. An intra-stack interconnect 420, such as a solder ball, connects the interposer 416 and the package carrier 406. The interposer 416 may include other structures (not shown), such as metal traces, metal layers, insulating layers, electrical vias, landing pads, or a combination thereof.

An intra-stack encapsulation 422, such as an encapsulation of molding compound or a molded underfill (MUF), is over the package carrier 406 and the intra-stack interconnect 420, partially covering the first integrated circuit device 404. The top device side 408 of the first integrated circuit device 404 is exposed by the intra-stack encapsulation 422. The intra-stack encapsulation 422 surrounds the interposer 416, preferably partially filling the central aperture 418, exposing a top interposer side 424 of the interposer 416. The intra-stack encapsulation 422 may also surround the first internal interconnect 412 and fill any gaps between the first integrated circuit device 404 and the package carrier 406, any gaps between the interposer 416 and the package carrier 406, or a combination thereof.

A top integrated circuit device 402 is mounted above the interposer 416 and over the first integrated circuit device 404, the intra-stack encapsulation 422, and the package carrier 406. An electrical connector 426, such as a solder ball, may connect the top integrated circuit device 402 and the interposer 416. In some cases, the interposer 416 may provide electrical interconnection between the top integrated circuit device 402 and the package carrier 406 through the electrical connector 426 and the intra-stack interconnect 420. External connective elements 428, such as solder balls, may also be provided under the package carrier 406 for electrical connection to the next system level.

A cavity 430 may be formed between the top integrated circuit device 402 and the top interposer side 424, the intra-stack encapsulation 422, the first integrated circuit device 404, or a combination thereof. The cavity 430 may provide clearance for airflow between the top integrated circuit device 402 and the first integrated circuit device 404 for thermal management. However, it is understood that in some cases, the cavity 430 may or may not exist or may be larger or smaller than the cavity 430 illustrated.

Optionally, a passive device 432, such as a discrete resistor, capacitor, or inductor, may be mounted over the interposer 416 and under the top integrated circuit device 402. It is understood that more than one type of the passive device 432 may be mounted on the interposer 416. For illustrative purposes, the passive device 432 may be mounted in more than one location on the interposer 416, and may be placed symmetrically about the central aperture 418. However, it is understood that each of the passive device 432 mounted need not be arranged on the interposer 416 in a symmetrical configuration.

It is understood that the number and placement of the first internal interconnect 412, the intra-stack interconnect 420, the electrical connector 426, and the external connective elements 428 as shown are provided for illustrative purposes, the number and placement for each may vary as needed.

Figure 5:
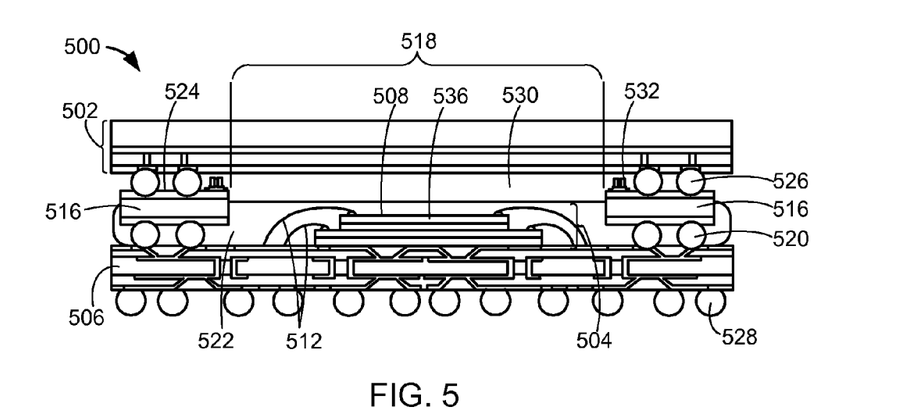
FIG. 5 is a cross-sectional view of a mountable integrated circuit package system exemplified by the top view of FIG. 1 in a third embodiment of the present invention.

Referring now to FIG. 5, therein is shown a cross-sectional view of an mountable integrated circuit package system 500 exemplified by the top view of FIG. 1 in a third embodiment of the present invention. The cross-sectional view depicts a first integrated circuit device 504, such as a stack of wire-bonded integrated circuit dies, mounted over a package carrier 506, such as a substrate. The first integrated circuit device 504 includes a top device side 508 of a top-most mounted integrated circuit die 536. The first integrated circuit device 504 is mounted over the package carrier 506. The first integrated circuit device 504 is electrically coupled to the package carrier 506 through a first internal interconnect 512, such as a wire bond or a ribbon bond.

An interposer 516, such as a substrate, including a central aperture 518 is mounted over the package carrier 506 with the first integrated circuit device 504 within the central aperture 518 of the interposer 516. An intra-stack interconnect 520, such as a solder ball, connects the interposer 516 and the package carrier 506. The interposer 516 may include other structures (not shown), such as metal traces, metal layers, insulating layers, electrical vias, landing pads, or a combination thereof.

An intra-stack encapsulation 522, such as an encapsulation of molding compound or a molded underfill (MUF), is over the package carrier 506, covering the first integrated circuit device 504 and the intra-stack interconnect 520. The intra-stack encapsulation 522 surrounds the interposer 516, preferably partially filling the central aperture 518 and exposing a top interposer side 524 of the interposer 516. The intra-stack encapsulation 522 may also surround the first internal interconnect 512 and fill any gaps between the first integrated circuit device 504 and the package carrier 506, any gaps between the interposer 516 and the package carrier 506, or a combination thereof.

A top integrated circuit device 502 is mounted above the interposer 516 and over the first integrated circuit device 504, the intra-stack encapsulation 522, and the package carrier 506. An electrical connector 526, such as a solder ball, may connect the top integrated circuit device 502 and the interposer 516. In some cases, the interposer 516 may provide electrical interconnection between the top integrated circuit device 502 and the package carrier 506 through the electrical connector 526 and the intra-stack interconnect 520. External connective elements 528, such as solder balls, may also be provided under the package carrier 506 for further electrical connection to the next system level.

A cavity 530 may be formed between the top integrated circuit device 502 and the top interposer side 524, the intra-stack encapsulation 522, the first integrated circuit device 504, or a combination thereof. The cavity 530 may provide clearance for airflow between the top integrated circuit device 502 and the first integrated circuit device 504 for thermal management. However, it is understood that in some cases, the cavity 530 may or may not exist, or may be larger or smaller than the cavity 530 illustrated.

Optionally, a passive device 532, such as a discrete resistor, capacitor, or inductor, may be mounted over the interposer 516 and under the top integrated circuit device 502. It is understood that more than one type of the passive device 532 may be mounted on the interposer 516. For illustrative purposes, the passive device 532 may be mounted in more than one location on the interposer 516, and may be placed symmetrically about the central aperture 518. However, it is understood that each of the passive device 532 mounted need not be arranged on the interposer 516 in a symmetrical configuration.

It is understood that the number and placement of the first internal interconnect 512, the intra-stack interconnect 520, the electrical connector 526, and the external connective elements 528 as shown are provided for illustrative purposes, the number and placement for each may vary as needed.

Figure 6:
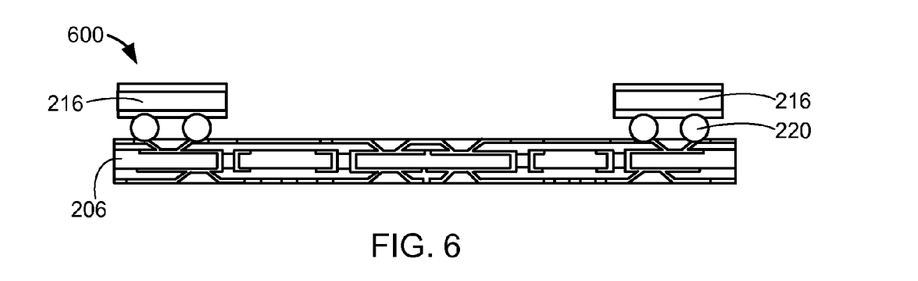
FIG. 6 is a cross-sectional view of a first intermediate structure of the mountable integrated circuit package system 100 of FIG. 2.

Referring now to FIG. 6, therein is shown a cross-sectional view of a first intermediate structure 600 of the mountable integrated circuit package system 100 of FIG. 2. The first intermediate structure 600 depicts the mountable integrated circuit package system 100 during a mounting phase of the interposer 216. In this cross-sectional view, the interposer 216 is mounted over the package carrier 206 with the intra-stack interconnect 220 providing connection between the interposer 216 and the package carrier 206.

Figure 7:
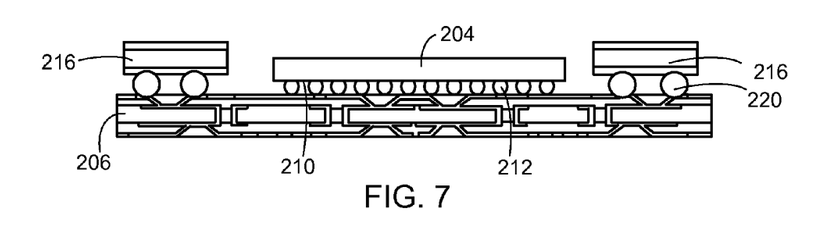
FIG. 7 is a cross-sectional view of the structure of FIG. 6 in a mounting phase of the first integrated circuit device.

Referring now to FIG. 7, therein is shown a cross-sectional view of the structure of FIG. 6 in a mounting phase of the first integrated circuit device 204. The first integrated circuit device 204 is mounted over the package carrier 206 with the bottom device side 210 that is active facing the package carrier 206. The first internal interconnect 212, such as a solder bump, connects the bottom device side 210 and the package carrier 206.

Figure 8:
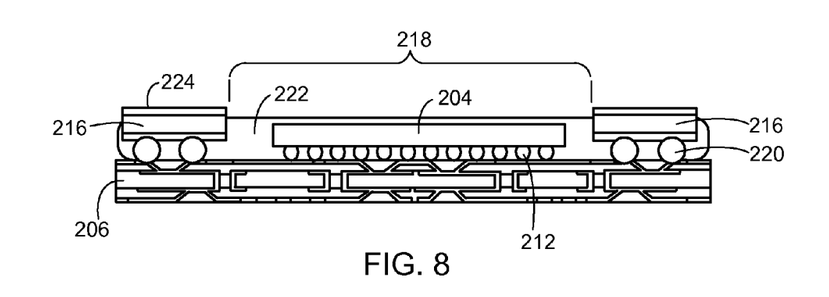
FIG. 8 is a cross-sectional view of the structure of FIG. 7 in a forming phase of the intra-stack encapsulation.

Referring now to FIG. 8, therein is shown a cross-sectional view of the structure of FIG. 7 in a forming phase of the intra-stack encapsulation 222. The intra-stack encapsulation 222, is formed over the package carrier 206, covering the first integrated circuit device 204 and the intra-stack interconnect 220. The intra-stack encapsulation 222 surrounds the interposer 216, partially filling the central aperture 218 and exposing the top interposer side 224. The intra-stack encapsulation 222 surrounds the first internal interconnect 212 and fills any gap between the first integrated circuit device 204 and the package carrier 206.

In some cases, the intra-stack encapsulation 222 or an intra-stack encapsulation precursor may be applied to the package carrier 206 as one or more liquids using one or more nozzles (not shown). For example, in some cases, a single nozzle may dispense a liquid intra-stack encapsulation material, or an intra-stack encapsulation precursor, or a combination thereof, in the region adjacent to the first integrated circuit device 204. The applied liquid intra-stack encapsulation material, the intra-stack encapsulation precursor, or a combination thereof, may subsequently flow before it reacts, sets or is cured into the final form of the intra-stack encapsulation 222. It is understood that in some cases, the intra-stack encapsulation materials, the intra-stack encapsulation precursor, or a combination thereof, may be dispensed in two or more steps and that the final composition of the intra-stack encapsulation 222 may or may not be uniform.

Figure 9:
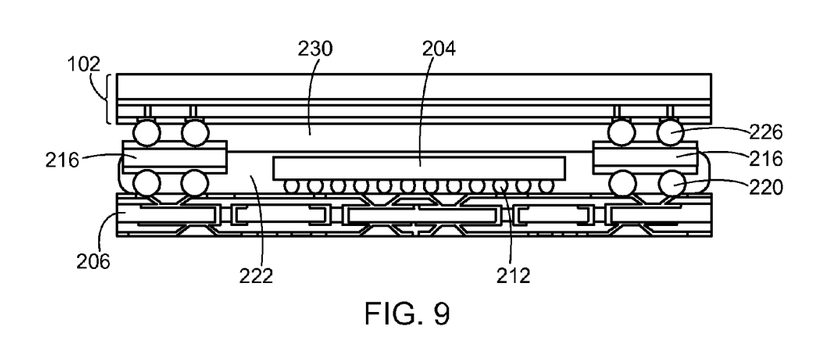
FIG. 9 is a cross-sectional view of the structure of FIG. 8 in a mounting phase of the top integrated circuit device.

Referring now to FIG. 9, therein is shown a cross-sectional view of the structure of FIG. 8 in a mounting phase of the top integrated circuit device 102. The top integrated circuit device 102 is mounted over the first integrated circuit device 204, the intra-stack encapsulation 222, and the interposer 216 with the electrical connector 226 between the top integrated circuit device 102 and the interposer 216. The cavity 230 may be formed between the top integrated circuit device 102 and the intra-stack encapsulation 222. In some cases, optionally, the cavity 230 between the top integrated circuit device 102 and the interposer 216 may be subsequently filled with additional material such as an encapsulant which may or may not have the same composition as the intra-stack encapsulation 222.

Figure 10:
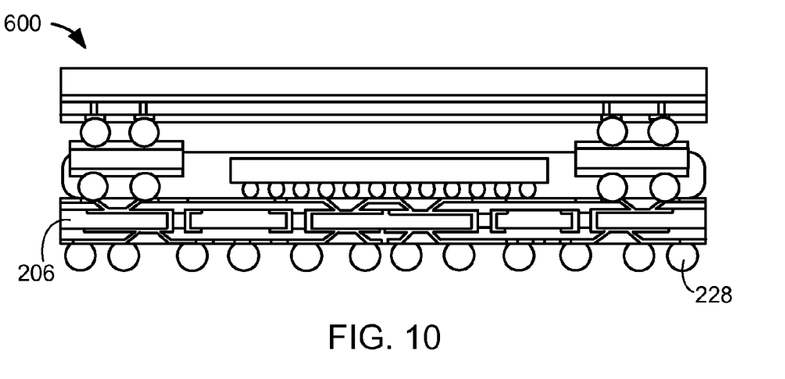
FIG. 10 is a cross-sectional view of the structure of FIG. 9 in a mounting phase of the external connective elements.

Referring now to FIG. 10, therein is shown a cross-sectional view of the structure of FIG. 9 in a mounting phase of the external connective elements 228. The cross-sectional view depicts the external connective elements 228 mounted under the package carrier 206 for further electrical connection.

It is understood that the first intermediate structure 600 may be manufactured using a different sequence of steps than those illustrated in FIGS. 6-10. It is also understood that additional steps may be incorporated into the process, including additional processing phases such as an optional mounting phase of the passive device 232 of FIG. 2 or the underfill 214 of FIG. 2, not shown in FIG. 10.

Figure 11:
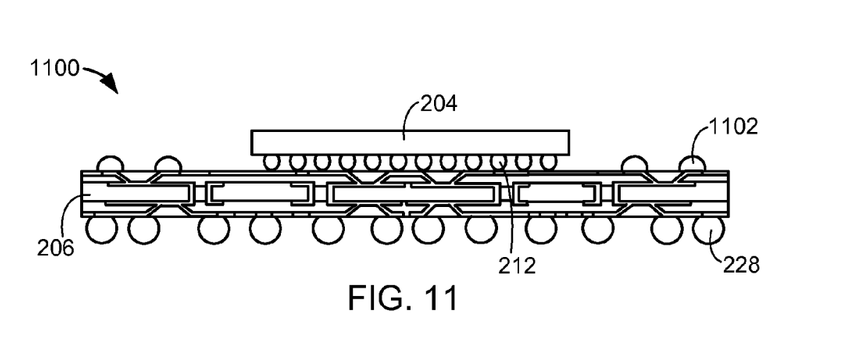
FIG. 11 is a cross-sectional view of a first intermediate structure of the mountable integrated circuit package system 100 of FIG. 2.

Referring now to FIG. 11, therein is shown a cross-sectional view of a first intermediate structure 1100 of the mountable integrated circuit package system 100 of FIG. 2. Optional to processing phases illustrated in FIGS. 6-7, the first intermediate structure 1100 depicts the mountable integrated circuit package system 100 during a mounting phase of the first integrated circuit device 204. The first integrated circuit device 204 is mounted over the package carrier 206 with the first internal interconnect 212 between the first integrated circuit device 204 and the package carrier 206. The first internal interconnect 212 may include connective material such as metallic solder bumps or solder balls mounted between the first integrated circuit device 204 and the package carrier 206.

Preferably, a first coupling bump 1102, such as a metallic solder bump may be selectively pre-deposited on the package carrier 206 for enhanced wettability to prepare the package carrier 206 for further mounting. The external connective elements 228, such as solder balls, are attached to a bottom side of the package carrier 206 for connection to the next system level, such as a printed circuit board.

Figure 12:
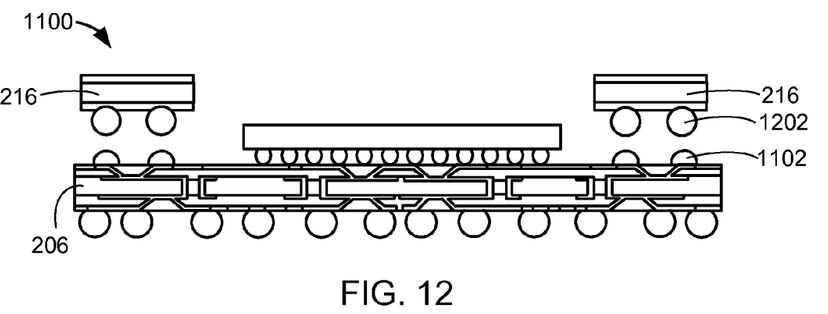
FIG. 12 is a cross-sectional view of the structure of FIG. 11 in a mounting phase of the interposer.

Referring now to FIG. 12, therein is shown a cross-sectional view of the structure of FIG. 11 in a mounting phase of the interposer 216. In this cross-sectional view, the interposer 216 is mounted over the package carrier 206. Preferably, the interposer 216 is mounted over the package carrier 206 with a second coupling bump 1202 provided under the interposer 216. The first coupling bump 1102 on the package carrier 206 preferably aligns and bonds with the second coupling bump 1202 under the interposer 216 to form the intra-stack interconnect 220 of FIG. 2. Bonding the first coupling bump 1102 and the second coupling bump 1202 in alignment, improves physical and electronic coupling between the interposer 216 and the package carrier 206. The first coupling bump 1102 on the package carrier 206 may or may not be made of the same materials as the second coupling bump 1202 under the interposer 216.

It is understood that the first intermediate structure 1100 may be manufactured using a different sequence of steps than those illustrated in FIGS. 11-12. It is understood that additional steps may be incorporated into the process illustrated in FIGS. 11-12, including the additional processing phases described above in FIGS. 8-10, such as the forming phase of the intra-stack encapsulation similar to discussed above in FIG. 8, the mounting phase of the top integrated circuit device similar to discussed above in FIG. 9, and the mounting of the external connective elements of FIG. 10. The first intermediate structure 1100 shown may differ from the mountable integrated circuit package system 100 shown in FIG. 2 depending on optional configurations, such as additional processing phases for incorporating the optional elements of the passive device 232 of FIG. 2 or the underfill 214 of FIG. 2, not shown herein.

Figure 13:
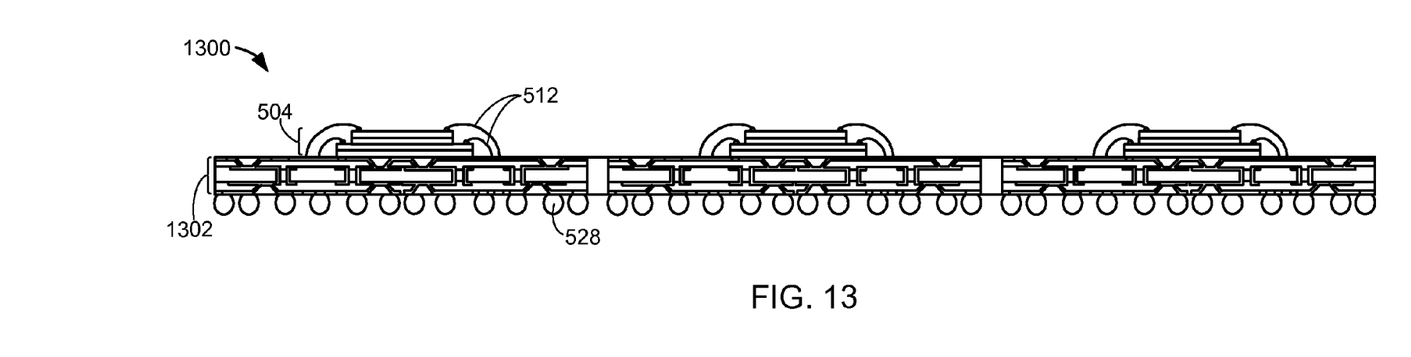
FIG. 13 is a cross-sectional view of a first intermediate structure of the mountable integrated circuit package system 500 of FIG. 5.

Referring now to FIG. 13, therein is shown a cross-sectional view of a first intermediate structure 1300 of the mountable integrated circuit package system 500 of FIG. 5. The first intermediate structure 1300 depicts a mounting phase of the first integrated circuit device 504 over a carrier strip 1302. The first integrated circuit device 504 is electrically coupled to the carrier strip 1302 with the first internal interconnect 512, such as a bond wire. Preferably, the carrier strip 1302 includes the external connective elements 528 attached under the carrier strip 1302.

Figure 14:
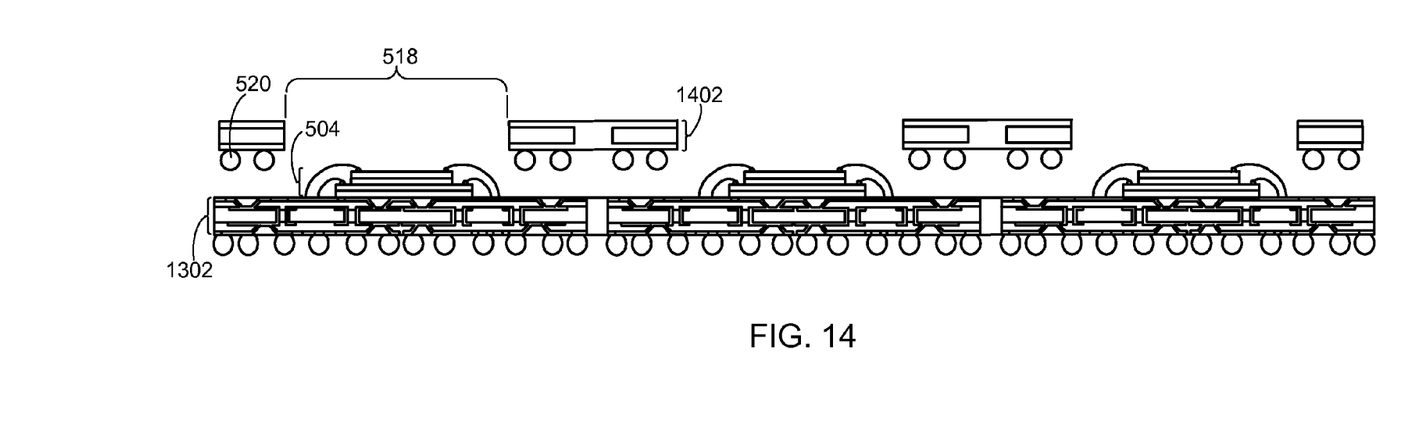
FIG. 14 is a cross-sectional view of the structure of FIG. 13 in a mounting phase of an interposers strip to the carrier strip.

Referring now to FIG. 14, therein is shown is a cross-sectional view of the structure of FIG. 13 in a mounting phase of an interposer strip 1402 to the carrier strip 1302. The central aperture 518 within the interposer strip 1402 is preferably aligned to the first integrated circuit device 504 so that the first integrated circuit device 504 is within the central aperture 518 of the interposer strip 1402. The interposer strip 1402 will be coupled to the carrier strip 1302 through the intra-stack interconnect 520, such as a solder ball mounted under the interposer strip 1402.

Figure 15:
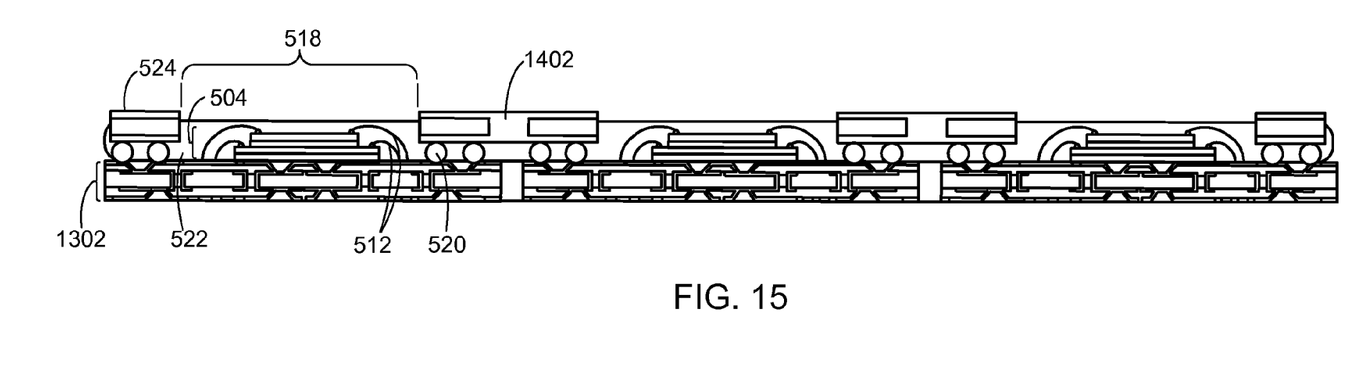
FIG. 15 is a cross-sectional view of the structure of FIG. 14 in a forming phase of the intra-stack encapsulation.

Referring now to FIG. 15, therein is shown is a cross-sectional view of the structure of FIG. 14 in a forming phase of the intra-stack encapsulation 522. The intra-stack encapsulation 522, such as an encapsulation of a molding compound or a molded underfill (MUF), is formed over the carrier strip 1302, covering the first integrated circuit device 504 and the intra-stack interconnect 520. The intra-stack encapsulation 522 surrounds the interposer strip 1402, partially filling the central aperture 518, exposing the top interposer side 524 of the interposer strip 1402. The intra-stack encapsulation 522 surrounds the first internal interconnect 512.

Although not shown, the intra-stack encapsulation 522 or an intra-stack encapsulation precursor may be applied to the carrier strip 1302 as one or more liquids using one or more nozzles. For example, in some cases, a single nozzle may dispense a liquid intra-stack encapsulation material, the intra-stack encapsulation precursor, or a combination thereof, in the regions adjacent to each of the first integrated circuit device 504. The applied liquid intra-stack encapsulation material, the intra-stack encapsulation precursor, or a combination thereof, may subsequently flow before it reacts, sets or is cured into the final shape of the intra-stack encapsulation 522 illustrated in FIG. 5. It is understood that in some cases, the intra-stack encapsulation materials, the precursor, or a combination thereof, may be dispensed in two or more steps and that the final composition of the intra-stack encapsulation 522 may or may not be uniform.

Figure 16:
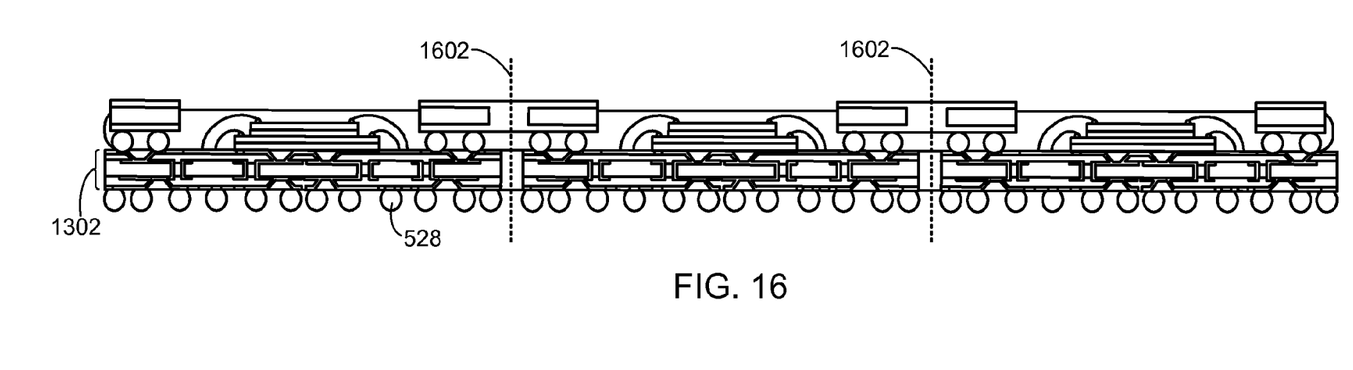
FIG. 16 is a cross-sectional view of the structure of FIG. 15 in a mounting phase of the external connective elements.

Referring now to FIG. 16, therein is shown is a cross-sectional view of the structure of FIG. 15 in a mounting phase of the external connective elements 528. The external connective elements 528, such as solder balls, are provided under the carrier strip 1302 to enable subsequent coupling to the next level system. Singulation lines 1602 indicate preferable positions where the carrier strip 1302 may be singulated prior to mounting of the top integrated circuit device 502 of FIG. 5.

It is understood that the first intermediate structure 1300 may be manufactured using a different sequence of steps than those illustrated. It is also understood that additional steps may be incorporated into the process illustrated in FIGS. 13-16, and may incorporate additional processing phase depending on optional configurations, such as an additional processing phase for incorporating the optional element such as the passive device, not shown herein.

Figure 17:
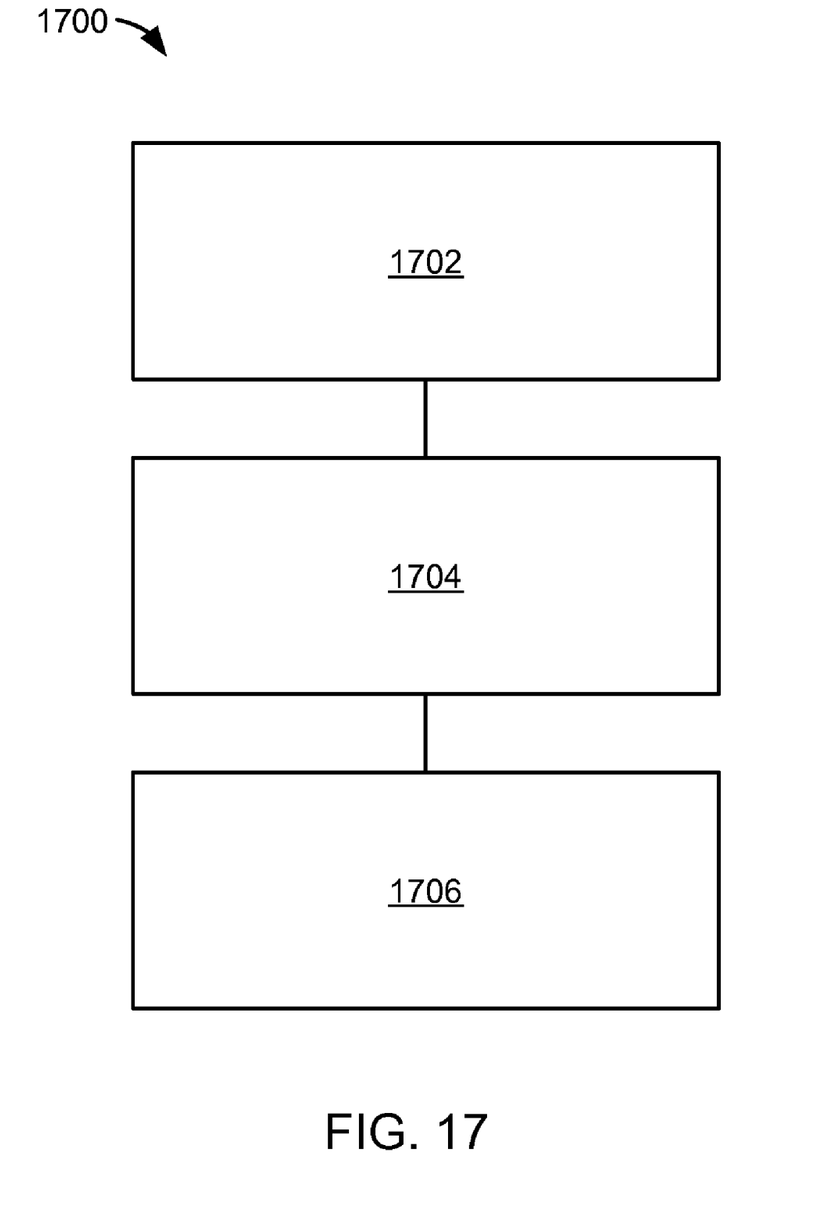
FIG. 17 is a flow chart of a mountable integrated circuit package system for manufacturing of the mountable integrated circuit package system in an embodiment of the present invention.

Referring now to FIG. 17, therein is shown a flow chart of a mountable integrated circuit package system 1700 for manufacturing the mountable integrated circuit package system 100 in an embodiment of the present invention. The system 1700 comprises mounting a first integrated circuit device over a package carrier in a block 1702; mounting an interposer including a central aperture over the package carrier, an intra-stack interconnect connected between the interposer and the package carrier, and the first integrated circuit device within the central aperture in a block 1704; and forming the intra-stack encapsulation over the package carrier and surrounding the interposer in a block 1706.

It has been discovered that the present invention provides a mountable integrated circuit package system having improved reliability and manufacturing yields. The configuration of the intra-stack encapsulation results in reduced warpage of the package carrier.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the mountable integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a mountable integrated circuit package system comprising: mounting a first integrated circuit device over a package carrier; mounting an interposer having a top surface and a bottom surface including a central aperture over the package carrier, an intra-stack interconnect connected on the bottom surface between the interposer and the package carrier, and the first integrated circuit device disposed within the central aperture; and forming an intra-stack encapsulation partially filling the central aperture, surrounding and in direct contact with the first integrated circuit device, over the package carrier, and surrounding the interposer, with the intra-stack encapsulation exposing the top surface of the interposer for receiving an electrical connector.

2. The method as claimed in claim 1 further comprising mounting a top integrated circuit device over the interposer.

3. The method as claimed in claim 1 wherein forming the intra-stack encapsulation includes surrounding an outer perimeter of the interposer with the intra-stack encapsulation.

4. The method as claimed in claim 1 wherein forming the intra-stack encapsulation includes exposing a top device side of the first integrated circuit device.

5. The method as claimed in claim 1 further comprising mounting a passive device over a top interposer side of the interposer.

6. A method for manufacturing a mountable integrated circuit package system comprising: mounting a first integrated circuit device over a package carrier; mounting an interposer having a top surface and a bottom surface including a central aperture over the package carrier, an intra-stack interconnect connected on the bottom surface between the interposer and the package carrier, and the first integrated circuit device disposed within the central aperture; forming an intra-stack encapsulation partially filling the central aperture, over the package carrier, surrounding the interposer and in direct contact with the first integrated circuit device, with the top surface of the interposer exposed for receiving an electrical connector and mounting a top integrated circuit device over the interposer with a cavity between the top integrated circuit device and the intra-stack encapsulation, with the top integrated circuit device connected to the electrical connector.

7. The method as claimed in claim 6 further comprising applying an underfill between the first integrated circuit device and the package carrier.

8. The method as claimed in claim 6 further comprising connecting a first internal interconnect between the first integrated circuit device and the package carrier.

9. The method as claimed in claim 6 wherein forming the intra-stack encapsulation includes forming the intra-stack encapsulation between the first integrated circuit device and the package carrier.

10. The method as claimed in claim 6 wherein forming the intra-stack encapsulation includes forming the intra-stack encapsulation between the interposer and the package carrier.

11. A mountable integrated circuit package system comprising: a first integrated circuit device mounted over a package carrier; an interposer having a top surface and a bottom surface including a central aperture mounted over the package carrier, an intra-stack interconnect connected on the bottom surface between the interposer and the package carrier, and the first integrated circuit device disposed within the central aperture; and an intra-stack encapsulation partially filling the central aperture, surrounding and in direct contact with the first integrated circuit device, over the package carrier, and surrounding the interposer, with the intra-stack encapsulation exposing the top surface of the interposer for receiving an electrical connector.

12. The system as claimed in claim 11 further comprising a top integrated circuit device mounted over the interposer.

13. The system as claimed in claim 11 wherein the intra-stack encapsulation surrounds an outer perimeter of the interposer.

14. The system as claimed in claim 11 wherein the intra-stack encapsulation exposes a top device side of the first integrated circuit device.

15. The system as claimed in claim 11 further comprising a passive device mounted over a top interposer side of the interposer.

16. The system as claimed in claim 11 further comprising a top integrated circuit device over the interposer with a cavity between the ton integrated circuit device and the intra-stack encapsulation.

17. The system as claimed in claim 16 further comprising an underfill formed between the first integrated circuit device and the package carrier.

18. The system as claimed in claim 16 further comprising a first internal interconnect between the first integrated circuit device and the package carrier.

19. The system as claimed in claim 16 wherein the intra-stack encapsulation includes the intra-stack encapsulation formed between the first integrated circuit device and the package carrier.

20. The system as claimed in claim 16 wherein the intra-stack encapsulation includes the intra-stack encapsulation formed between the interposer and the package carrier.

* * * * *

UNITED STATES PATENT AND TRADEMARK OFFICE
CERTIFICATE OF CORRECTION

| | | |
|---|---|---|
| PATENT NO. | : 8,247,893 B2 | Page 1 of 1 |
| APPLICATION NO. | : 11/965653 | |
| DATED | : August 21, 2012 | |
| INVENTOR(S) | : Kim et al. | |

It is certified that error appears in the above-identified patent and that said Letters Patent is hereby corrected as shown below:

In the Claims:

Column 12, claim 16, line 36, delete "the ton" and insert therefor --the top--

Signed and Sealed this
Third Day of November, 2015

Michelle K. Lee
*Director of the United States Patent and Trademark Office*